United States Patent
Lin et al.

(10) Patent No.: US 12,031,208 B2
(45) Date of Patent: *Jul. 9, 2024

(54) ATOMIC LAYER DEPOSITION APPARATUS FOR POWDERS

(71) Applicant: SKY TECH INC., Hsinchu County (TW)

(72) Inventors: Jing-Cheng Lin, Hsinchu County (TW); Jung-Hua Chang, Hsinchu County (TW); Chia-Cheng Ku, Hsinchu County (TW)

(73) Assignee: SKY TECH INC., Hsinchu County (TW)

( * ) Notice: Subject to any disclaimer, the term of this patent is extended or adjusted under 35 U.S.C. 154(b) by 322 days.

This patent is subject to a terminal disclaimer.

(21) Appl. No.: 17/334,771

(22) Filed: May 30, 2021

(65) Prior Publication Data

US 2022/0106682 A1 Apr. 7, 2022

(30) Foreign Application Priority Data

Oct. 6, 2020 (TW) .................................. 109134657

(51) Int. Cl.
*C23C 16/44* (2006.01)
*C23C 16/455* (2006.01)

(52) U.S. Cl.
CPC ...... *C23C 16/4417* (2013.01); *C23C 16/4412* (2013.01); *C23C 16/45544* (2013.01)

(58) Field of Classification Search
None
See application file for complete search history.

(56) References Cited

U.S. PATENT DOCUMENTS

| 10,593,537 | B1* | 3/2020 | Messinger | ............ | H01L 21/304 |
| 11,739,423 | B2* | 8/2023 | Lin | ..................... | C23C 16/4417 118/716 |
| 11,767,591 | B2* | 9/2023 | Lin | ..................... | C23C 16/4412 118/719 |
| 11,891,695 | B2* | 2/2024 | Lin | ......................... | C23C 16/46 |
| 2002/0112792 | A1* | 8/2002 | Kemp | ....................... | F27B 7/00 266/172 |
| 2004/0052984 | A1* | 3/2004 | Toth | ........................ | C23C 24/06 428/34.1 |

(Continued)

*Primary Examiner* — Karla A Moore
(74) *Attorney, Agent, or Firm* — Chun-Ming Shih; HDLS IPR SERVICES (57) ABSTRACT

An atomic layer deposition apparatus for powders is disclosed. The atomic layer deposition apparatus includes a vacuum chamber, a shaft sealing device, and a driving unit. The shaft sealing device includes an outer tube and an inner tube, wherein the inner tube extends from an accommodating space of the outer tube to a reaction space of the vacuum chamber, forming a protruding tube part in the reaction space. The driving unit drives the vacuum chamber to rotate through the outer tube to agitate the powders in the reaction space. The ratio between the protruding tube part and the reaction space is within a specific range, so that a non-reactive gas delivered to the reaction space blows the powders around in the reaction space and spreads the powders to various areas of the reaction space to form a thin film with a uniform thickness on the surface of the powders.

20 Claims, 5 Drawing Sheets

(56) References Cited

U.S. PATENT DOCUMENTS

| | | | |
|---|---|---|---|
| 2012/0085284 A1* | 4/2012 | Dassel | C23C 16/442 118/716 |
| 2012/0145041 A1* | 6/2012 | Walters | B82Y 40/00 977/773 |
| 2013/0059073 A1* | 3/2013 | Jiang | C04B 35/62222 118/715 |
| 2015/0125599 A1* | 5/2015 | Lindfors | C23C 16/45555 118/716 |
| 2022/0106684 A1* | 4/2022 | Lin | C23C 16/45574 |
| 2022/0136103 A1* | 5/2022 | Lin | C23C 16/45544 118/719 |
| 2022/0162750 A1* | 5/2022 | Lin | C23C 16/4417 |
| 2022/0341036 A1* | 10/2022 | Lin | C23C 16/45525 |
| 2023/0120393 A1* | 4/2023 | Lin | C23C 16/4417 118/715 |

\* cited by examiner

ATOMIC LAYER DEPOSITION APPARATUS FOR POWDERS

REFERENCE TO RELATED APPLICATIONS

This non-provisional application claims priority claim under 35 U.S.C. § 119(a) on Taiwan Patent Application No. 109134657 filed Oct. 6, 2020, the entire contents of which are incorporated herein by reference.

TECHNICAL FIELD

The present disclosure relates to an atomic layer deposition apparatus for powders, more particularly, to an atomic layer deposition apparatus with a specific ranged size ratio of a reaction space and a protruding tube part in the reaction space so that powders are blown around in the reaction space by non-reactive gas for enhancing a formation of thin films with uniform thickness on the surface of powders.

BACKGROUND

Nanoparticle is generally defined as a particle that is smaller than 100 nanometers in at least one dimension, and in comparison to macroscopic matter, nanoparticle is completely different in both physical and chemical properties. Broadly speaking, the physical property of macroscopic matter is unrelated to its size, but the same cannot be said for nanoparticle. Nanoparticles are now being studied for potential applications in biomedical, optical, and electronic fields.

Quantum dot is a semiconductor nanoparticle and the semiconductor material currently being studied includes materials in groups II~VI like ZnS, CdS, CdSe, etc, in which CdSe is the most promising. The size of Quantum dot is usually between 2 to 10 nanometers. Electron in the quantum dot absorbs energy after being irradiated by ultra-violet light and transitions from valence band to conductance band. When the stimulated electron returns to the valence band from the conductance band, it releases the energy by emission of light.

The energy gap of a quantum dot is associated to its size, wherein the larger the size of a quantum dot, the smaller the energy gap which in turn emits light with longer wavelength after radiation, and the smaller the size of a quantum dot, the larger the energy gap which in turn emits light with shorter wavelength after radiation. For example, a quantum dot of 5 to 6 nanometers emits orange or red light, whereas a quantum dot of 2 to 3 nanometers emits blue or green light; the light color is, of course, determined by the material composition of the quantum dot.

Light generated by light emitting diode (LED) that utilizes quantum dots is near continuous spectrum and has good color rendering, which are beneficial in improving the luminous quality of LED. In addition, the wavelength of the emitted light can be adjusted by changing the size of quantum dot. Therefore quantum dots have become a main focus in developing the next generation of light-emitting devices and displays.

Although quantum dots have the aforementioned advantages and properties, agglomeration of the quantum dots occurs easily during application and manufacturing process. Moreover, quantum dots have higher surface activities and are prone to react with air and water vapor, which are factors that shorten the life cycle of nanoparticles.

In particular, agglomeration occurs when the quantum dots are being manufactured as sealant for LED and thereby decreasing the optical performance of quantum dots. Further, after the quantum dots are made as the sealant of LED, it is still possible for surrounding oxygen or water vapor to penetrate through the sealant and come in contact with the surface of the quantum dots, thereby causing the quantum dots to be oxidized and affecting the efficacy or life cycle of the quantum dots and LED. The surface defects and dangling bonds of the quantum dots may also cause non-radiative recombination, which also affects the luminous efficiency of quantum dots.

Atomic layer deposition (ALD) is a process currently used by industries to form a thin film with nanometer thickness or a plurality of thin films on the surface of the quantum dots to form a quantum well.

ALD process can form a thin film with a uniform thickness on a substrate with precision in controlling the thickness of the thin film, and so in theory ALD process could also be applicable to three-dimensioned quantum dots. When the quantum dots sit on a support pedestal, contacts exist between adjacent quantum dots, and these contacts cannot be reached by precursor gas of ALD. Thus, thin films with uniform thickness cannot be formed on the surface of all nanoparticles.

SUMMARY

To solve the aforementioned issues, the present disclosure provides an atomic layer deposition apparatus for powders that is capable of agitating powders during the atomic layer deposition (ALD) process such that the powders are diffused and spread out in a reaction space of a vacuum chamber, so as to coat a thin film with a uniform thickness on the surface of each powder.

An object of the present disclosure is to provide an atomic layer deposition apparatus for powders, mainly including a driving unit, a shaft sealing device, and a vacuum chamber, wherein through the shaft sealing device, the driving unit is connected to the vacuum chamber and drives the vacuum chamber to rotate. The shaft sealing device includes an outer tube and an inner tube, wherein the inner tube is disposed in an accommodating space of the outer tube and extends to a reaction space of the vacuum chamber, forming a protruding tube part in the reaction chamber. The driving unit is connected to the vacuum chamber through the outer tube and drives the vacuum chamber to rotate through the outer tube. When the driving unit drives the outer tube and the vacuum chamber to rotate, the inner tube stays stationary.

The reaction space includes a first length and a first width, and the protruding tube part includes a second length and a second width. A ratio of the first length, the second length, the first width and/or the second width is within a specific range, which maximizes the agitation of powders in the reaction space caused by the rotation of vacuum chamber and the introduction of non-reactive gas to the reaction space, so as to coat a thin film with a uniform thickness on the surface of each powder by ALD process.

An object of the present disclosure is to provide an atomic layer deposition apparatus that has a reaction space of any geometric columnar shape, a first length being the longest length of the reaction space, and a first width being the widest width of the reaction space.

To achieve the aforementioned objects, the present disclosure provides an atomic layer deposition apparatus for powders, which includes a vacuum chamber, a shaft sealing device, a driving unit, at least one air extraction line, and at least one air intake line. The vacuum chamber includes a reaction space for accommodating a plurality of powders. The shaft sealing device includes an outer tube and an inner tube, wherein the outer tube has an accommodating space for accommodating the inner tube, and the inner tube has a connection space and extends from the accommodating space to the reaction space of the vacuum chamber, forming a protruding tube part. The driving unit is connected to the vacuum chamber through the shaft sealing device and, through the outer tube, drives the vacuum chamber to rotate. The air extraction line is disposed in the connection space of the inner tube and is fluidly connected to the reaction space of the vacuum chamber for extracting a gas in the reaction space. The air intake line is disposed in the connection space of the inner tube and is fluidly connected to the reaction space of the vacuum chamber for transporting a precursor or a non-reactive gas to the reaction space, wherein the non-reactive gas is used for blowing the powders around in the reaction space. The reaction space has a first length, and the protruding tube part has a second length, wherein a direction of the first length of the reaction space and the second length of the protruding tube part is in parallel with a rotating axis of the vacuum chamber, and a ratio of the second length to the first length is between 0.1 and 0.8.

The present disclosure provides an atomic layer deposition apparatus for powders, which includes a vacuum chamber, a shaft sealing device, a driving unit, at least one air extraction line, and at least one air intake line. The vacuum chamber includes a reaction space for accommodating a plurality of powders. The shaft sealing device includes an outer tube and an inner tube, wherein the outer tube has an accommodating space for accommodating the inner tube, and the inner tube has a connection space and extends from the accommodating space to the reaction space of the vacuum chamber and forms a protruding tube part. The driving unit is connected to the vacuum chamber through the shaft sealing device and, through the outer tube, drives the vacuum chamber to rotate. The air extraction line is disposed in the connection space of the inner tube and is fluidly connected to the reaction space of the vacuum chamber for extracting a gas in the reaction space. The air intake line is disposed in the connection space of the inner tube and is fluidly connected to the reaction space of the vacuum chamber for transporting a precursor or a non-reactive gas to the reaction space, wherein the non-reactive gas is used for blowing the powders around in the reaction space. The reaction space has a first width and a first length, wherein a direction of the first length of the reaction space is in parallel with a rotating axis of the vacuum chamber, the first width is perpendicular to the first length, and a ratio of the first width to the first length is between 0.5 and 3.

The present disclosure provides an atomic layer deposition apparatus for powders, which includes a vacuum chamber, a shaft sealing device, a driving unit, at least one air extraction line, and at least one air intake line. The vacuum chamber includes a reaction space for accommodating a plurality of powders. The shaft sealing device includes an outer tube and an inner tube, wherein the outer tube has an accommodating space for accommodating the inner tube, and the inner tube has a connection space and extends from the accommodating space to the reaction space of the vacuum chamber, forming a protruding tube part. The driving unit is connected to the vacuum chamber through the shaft sealing device and, through the outer tube, drives the vacuum chamber to rotate. The air extraction line is disposed in the connection space of the inner tube and is fluidly connected to the reaction space of the vacuum chamber for extracting a gas in the reaction space. The air intake line is disposed in the connection space of the inner tube and is fluidly connected to the reaction space of the vacuum chamber for transporting a precursor or a non-reactive gas to the reaction space, wherein the non-reactive gas is used for blowing the powders around in the reaction space. The reaction space has a first width and the protruding tube part has a second width, wherein a direction of the first width of the reaction space and the second width of the protruding tube part is perpendicular to a rotating axis of the vacuum chamber, and a ratio of the first width to the second width is between 1.5 and 6.

Preferably, the air intake line includes at least one non-reactive gas line disposed in the connection space of the inner tube and fluidly connected to the reaction space of the vacuum chamber for transporting the non-reactive gas to the reaction space of the vacuum chamber so as to blow the powder around in the reaction space.

Preferably, the reaction space has a wavy circular columnar shape or a polygonal columnar shape. The first length is the longest length of the reaction space and the first width is the widest width of the reaction space.

Preferably, the vacuum chamber includes a recess. The recess is disposed at a bottom of the vacuum chamber and extends from the bottom of the vacuum chamber to the reaction space for accommodating the inner tube.

Preferably, the vacuum chamber is fixed to the shaft sealing device through at least one fixing member, and the vacuum chamber separates from the shaft sealing device when the fixing member is dislodged.

BRIEF DESCRIPTION OF THE DRAWINGS

The structure as well as preferred modes of use, further objects, and advantages of this present disclosure will be best understood by referring to the following detailed description of some illustrative embodiments in conjunction with the accompanying drawings, in which.

DETAILED DESCRIPTION OF THE PREFERRED EMBODIMENTS

Figure 1:
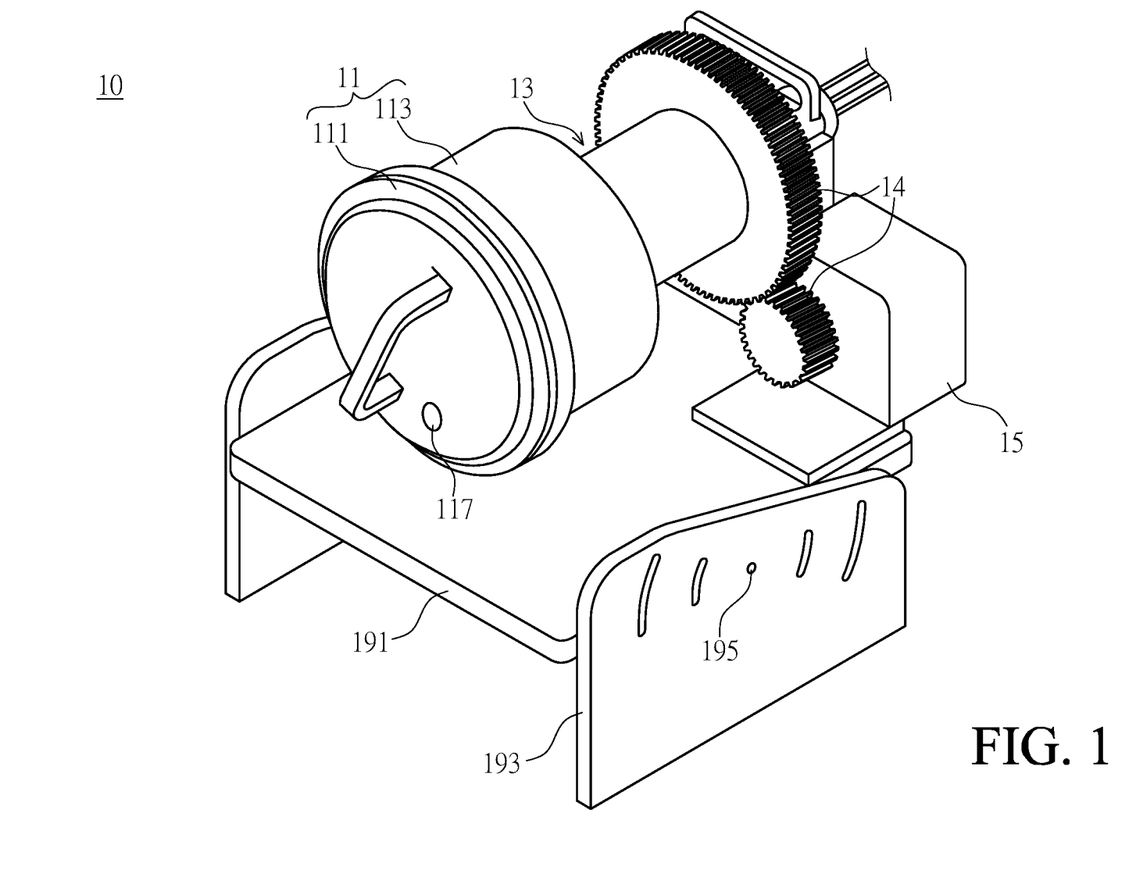
FIG. 1 is a schematic diagram of an atomic layer deposition apparatus for powders according to an embodiment of the present disclosure.
Figure 2:
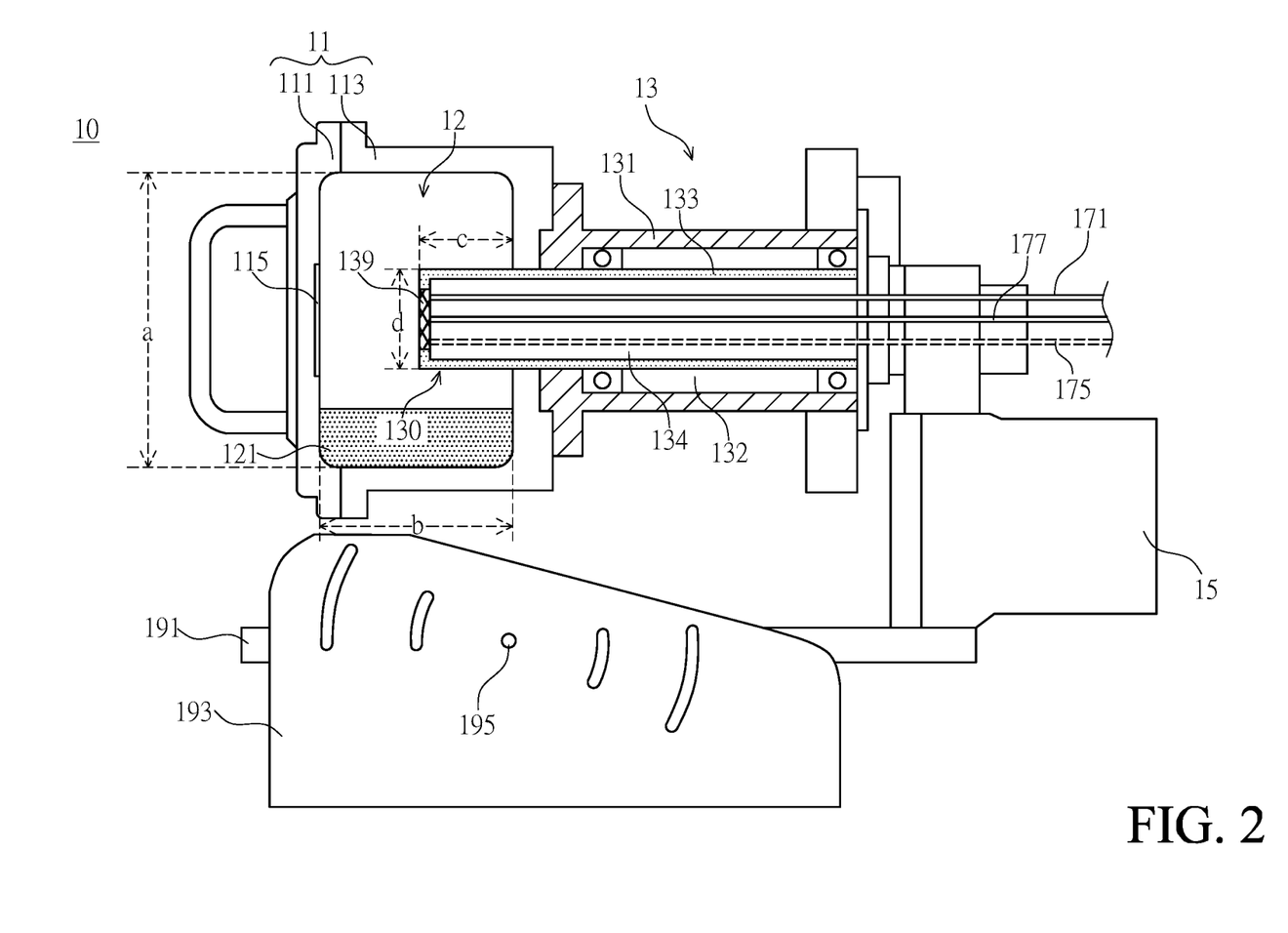
FIG. 2 is a cross-sectional schematic diagram of an atomic layer deposition apparatus for powders according to an embodiment of the present disclosure.

Referring to FIG. 1 and FIG. 2, an atomic layer deposition apparatus 10 for powders includes a vacuum chamber 11, a shaft sealing device 13, and a driving unit 15. As shown in the figures, the driving unit 15 is connected to the vacuum chamber 11 through the shaft sealing device 13 and drives the vacuum chamber 11 to rotate.

The vacuum chamber 11 has a reaction space 12 for accommodating a plurality of powders 121 such as quantum dots. The quantum dots may be made of semiconductor material like ZnS, CdS, CdSe, etc in groups II~VI, and a thin film formed on each of the quantum dots may be aluminum oxide ($Al_2O_3$). The vacuum chamber 11 includes a cover lid 111 and a chamber 113, wherein the cover lid 111 is used to cover the chamber 113 so as to form the reaction space 12 between the cover lid and the chamber 113.

In one embodiment, an inner surface of the cover lid 111 is used to cover the chamber 113 to form the reaction space 12 between the cover lid 111 and the chamber 113, and a monitor wafer 115 is disposed on the inner surface of the cover lid 111.

In one embodiment, the shaft sealing device 13 includes an outer tube 131 and an inner tube 133, wherein the outer tube 131 has an accommodating space 132 and the inner tube 133 has a connection space 134. The outer tube 131 and the inner tube 133 may, for example, be hollow columnar objects or have a hollow columnar shape. The accommodating space 132 of the outer tube 131 is used to accommodate the inner tube 133, and the outer tube 131 and the inner tube 133 are configured to be coaxial. The shaft sealing device may be a common shaft seal or a magnetic fluid shaft seal and is mainly used for isolating the reaction space 12 of the vacuum chamber 11 from outer spaces to maintain vacuum in the reaction space 12.

The driving unit 15 is mechanically connected to the vacuum chamber 11 through the outer tube 131, and drives the vacuum chamber 11 to rotate through the outer tube 131. The driving unit 15 is not connected to the inner tube 133, and thus when the driving unit 15 drives the outer tube 131 and the vacuum chamber 11 to rotate, the inner tube 133 does not rotate along therewith. In one embodiment, the driving unit 15 is a motor, which is connected to the outer tube 131 through a gear 14, and through the gear 14, drives the outer tube 131 and the vacuum chamber 11 to rotate relative to the inner tube 133.

The driving unit 15 may drive the outer tube 131 and the vacuum chamber 11 to rotate continuously in one direction, like clockwise or counterclockwise. In different embodiments, the driving unit 15 may drive the outer tube 131 and the vacuum chamber 11 to rotate in the clockwise direction by a specific angle, and then in the counterclockwise direction by the specific angle; the angle is, for example, 360 degrees. As the vacuum chamber 11 rotates, the powders 121 in the reaction space 12 are stirred and agitated, which in turn helps the powders 121 to come in contact with a precursor gas or a non-reactive gas.

Figure 3:
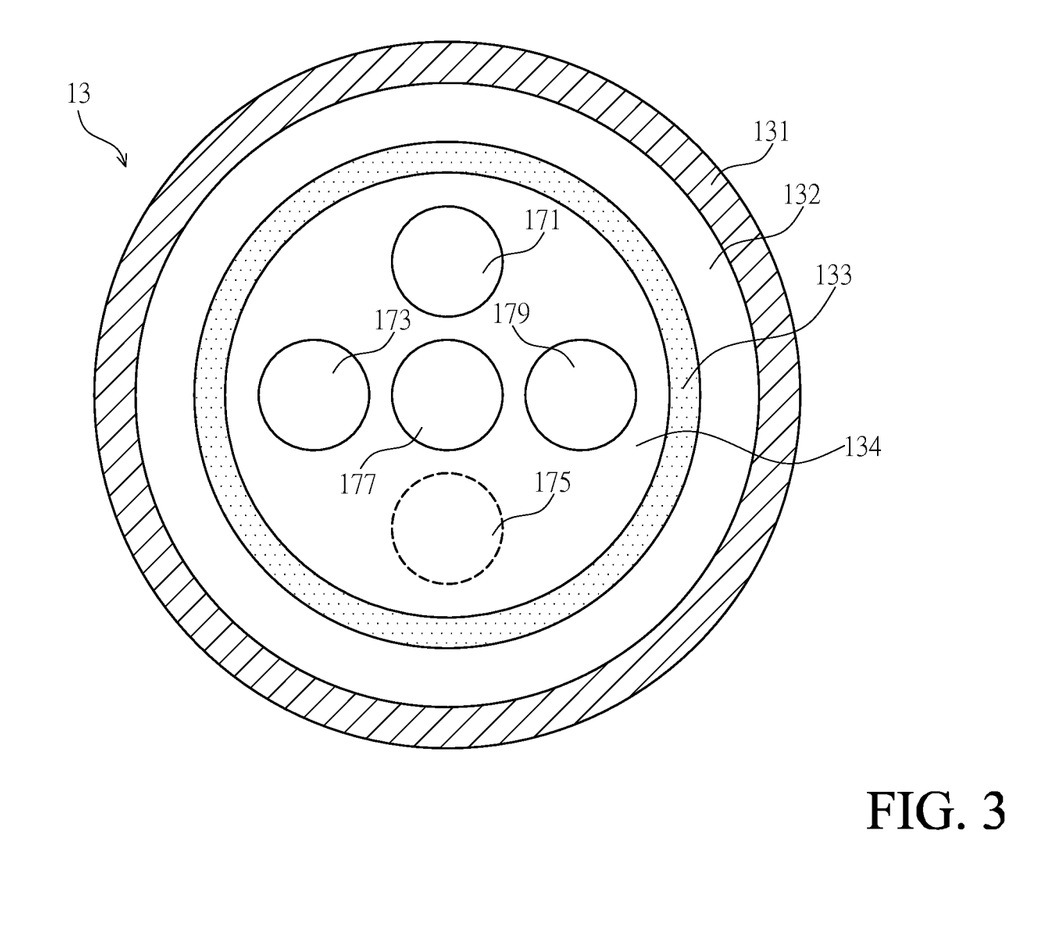
FIG. 3 is a cross-sectional schematic diagram of a partial structure of an atomic layer deposition apparatus for powders according to an embodiment of the present disclosure.

As shown in FIG. 2 and FIG. 3, at least one air extraction line 171, at least one air intake line 173, at least one non-reactive gas line 175, a heater 177 and/or a temperature sensing unit 179 are disposed in the connection space 134 of the inner tube 133.

The air extraction line 171 is fluidly connected to the reaction space 12 of the vacuum chamber 11 and is used to extract gas from the reaction space 12 to create vacuum in the reaction space 12 for subsequent ALD process. In particular, the air extraction line 171 can connect to a pump and use the pump to extract the gas in the reaction space 12.

The air intake line 173 is fluid connected to the reaction space 12 of the vacuum chamber 11 and is used to transport/deliver a precursor or a non-reactive gas to the reaction space 12, wherein the non-reactive gas is a noble gas such as nitrogen or argon. The air intake line 173 can, for example, be connected to a precursor storage tank and a non-reactive gas storage tank through a valve set, and through the valve set, transport the precursor gas to the reaction space 12 to form a thin film on the surface of each powder 121 in the reaction space 12. In practical application, the air intake line 173 may send a carrier gas together with the precursor gas to the reaction space. Then, the air intake line 173 transports the non-reactive gas to the reaction space 12 through the valve set in addition to the air extraction line 171 extracting gas from the reaction space 12 to remove the precursor gas in the reaction space 12. In one embodiment, the air intake line 173 is connected to a plurality of branch lines and transports different precursor gases to the reaction space 12 sequentially through the respective branch lines.

The air intake line 173 is also capable of increasing a flow of non-reaction gas delivered to the reaction space 12, so as to blow the powders 121 around in the reaction space 12 by the non-reaction gas, such that the powders 121 are carried by the non-reactive gas and diffused to various areas and all regions of the reaction space 12.

In one embodiment, the air intake line 173 includes the at least one non-reactive gas line 175, wherein the non-reactive gas line 175 is fluid connected to the reaction space 12 of the vacuum chamber 11 and is used to transport a non-reactive gas to the reaction space 12. The non-reactive gas line 175 can, for example, be connected to a nitrogen storage tank through a valve set, and through the valve set, transport the nitrogen to the reaction space 12. The non-reactive gas is used to blow the powders 121 around in the reaction space 12, and in combination with the rotating of the vacuum chamber 11 driven by the driving unit 15, the powders 121 in the reaction space 12 are effectively and evenly stirred and agitated, thereby contributing in forming a thin film with a uniform thickness on the surface of each powder 121.

The air intake line 173 and the non-reactive gas line 175 of the atomic layer deposition apparatus 10 for powders are both used to transport non-reactive gas to the reaction space 12. The flow of non-reactive gas transported by the air intake line 173 is smaller as the main purpose of which is for removing the precursor gas in the reaction space 12, whereas the flow of non-reactive gas transported by the non-reactive gas line 175 is larger and is mainly used to blow the powders 121 around the reaction space 12.

More specifically, the timings at which the air intake line 173 and the non-reactive gas line 175 transport the non-reactive gas to the reaction space 12 are different. Hence, the non-reactive gas line 175 may be omitted in practical application, and instead, the flow of non-reactive gas transported by the air intake line 173 is adjusted at different timings. For instance, when removing the precursor gas from the reaction space 12, the flow of non-reactive gas being transported to the reaction space 12 by the air intake line 173 is lowered, and when blowing the powders 121 around in the reaction space 12, the flow of non-reactive gas being transported to the reactions space by the air intake line 173 is enlarged.

The heater 177 is used to heat the connection space 134 and the inner tube 133. By heating the air extraction line 171, the air intake line 173 and/or the non-reactive gas line 175 in the inner tube 133 with the heater 177, temperatures of the gases in the air extraction line 171, the air intake line 173 and/or the non-reactive gas line 175 can be increased. For example, the temperature of non-reactive gas and/or the precursor gas transported by the air intake line 173 to the reaction space 12 may be increased, and the temperature of non-reactive gas transported by the non-reactive gas line 175 to the reaction space 12 may be increased. As such, when the non-reactive gas and/or the precursor gas enter the reaction space 12, the temperature of the reaction space 12 would not drop or change drastically. Moreover, a temperature sensing unit 179 is used to measure the temperature of the heater 177 or the connection space 134 to monitor an operation status of the heater 177. Additional heating device is often disposed inside of, outside of, or surrounding the vacuum chamber 11, wherein the heating device is adjacent to or in contact with the vacuum chamber 11 for heating the vacuum chamber 11 and the reaction space 12.

In one embodiment, the inner tube 133 of the shaft sealing device 13 extends from the accommodating space 132 of the outer tube 131 into the reaction space 12 of the vacuum chamber 11, wherein the part of the inner tube 133 in the reaction space 12 is defined to be a protruding tube part 130. The air extraction line 171, the air intake line 173, the non-reactive gas line 175, the heater 177 and/or the temperature sensing unit 179 disposed in the connection space 134 of the inner tube 133 are also positioned in the protruding tube part 130. A distance between the air intake line 173 and/or the non-reactive gas line 175 can be shortened or is adjustable through the arrangement of the protruding tube part 130, so that the non-reactive gas transported by the air intake line 173 and/or the non-reactive gas line 175 to the reaction space 12 is delivered onto the cover lid 111 and diffused/spread out to all regions of the reaction space through the cover lid 111.

In one embodiment of the present disclosure, a filter unit 139 is disposed at one end of the protruding tube part 130 or the inner tube 133 that is connected to the reaction space 12. The air extraction line 171 is fluidly connected to the reaction space 12 through the filter unit 139, and extracts the gas from the reaction space 12 to pass through the filter unit 139. The filter unit 139 is mainly used to filter the powders 121 in the reaction space 12 to prevent the powders 121 from entering the air extraction line 171 during gas extraction and causing loss of the powders 121.

As shown in FIG. 2, the shape of the reaction space 12 of the vacuum chamber 11 is similar to a columnar object with a first width a and a first length b. When the reaction space has a circular columnar shape, the first width a is the diameter of the circular column, and the first length b is the height of the circular column in its axial direction. Further, the protruding tube part 130 appears to be a circular columnar object with a second width d and a second length c, wherein the second width d is the diameter of the circular column object and the second length is the protruded height of the circular column object in its axial direction.

In the present disclosure, the powders 121 in the space 12 are fully and evenly stirred and agitated by the rotation of the vacuum chamber 11 in combination with the non-reactive gas being transported by the non-reactive gas line 175 to the reaction space 12.

The inventor believes that how well the powders 121 are stirred/agitated in the reaction space 12 is associated to the ratio between the reaction space 12 of the vacuum chamber 11 and the protruding tube part 130 of the shaft sealing device 13. Through numerous attempts and experiences, the inventor has found the best ratio range between the respective length and width of the reaction space 12 and/or the protruding tube part 130 for evenly spreading the powders 121 in the vacuum chamber 11 and forming a thin film with a uniform thickness on the surface of each powder 121.

In one embodiment, the first length b of the reaction space 12 and the second length c of the protruding tube part 130 are in parallel with a direction of the rotating axis of the vacuum chamber 11, and the ratio of the second length c of the protruding tube part 130 to the first length b of the reaction space 12 is larger than 0.1 and smaller than 0.8.

In on embodiment, the first length b of the reaction space 12 is parallel with a direction of the rotating axis of the vacuum chamber, and the first width a of the reaction space 12 is perpendicular to the first length b. The ratio of the first width a to the first length b of the reaction space 12 is larger than 0.5 and smaller than 3.

In one embodiment, the first width a of the reaction space 12 and the second width d of the protruding tube part 130 are perpendicular to a direction of the rotating axis of the vacuum chamber 11, and the ratio of the first width a of the reaction space 12 to the second width b of the protruding tube part 130 is larger than 1.5 and smaller than 6.

For instance, the first width a of the reaction space 12 is 160 mm to 230 mm, the first length b of the reaction space 12 is 80 mm to 90 mm, the second width d of the protruding tube part is 40 mm to 60 mm, and the second length c of the protruding tube part is 40 mm to 60 mm. The dimensions of the lengths and widths abovementioned for the reactions space 12 and the protruding tube part 130 are merely an example of the present disclosure, and the present disclosure is not limited thereto.

In practical application, the first width a and the first length b of the reaction space 12 and the second width d and the second length c of the protruding tube part 130 can be changed in accordance with specific requirements. As long as the ratio between the width and/or the length of the reaction space 12 and/or the protruding tube part 130 falls within the range of the aforementioned embodiments, the powders 121 in the reaction space 12 can be completely and evenly stirred and agitated through the rotation of the vacuum chamber 11 and the non-reactive gas introduced into the reaction space 12. Therefore, a thin film with a uniform thickness can be formed on the surface of each powder 121 by ALD process.

Figure 4:
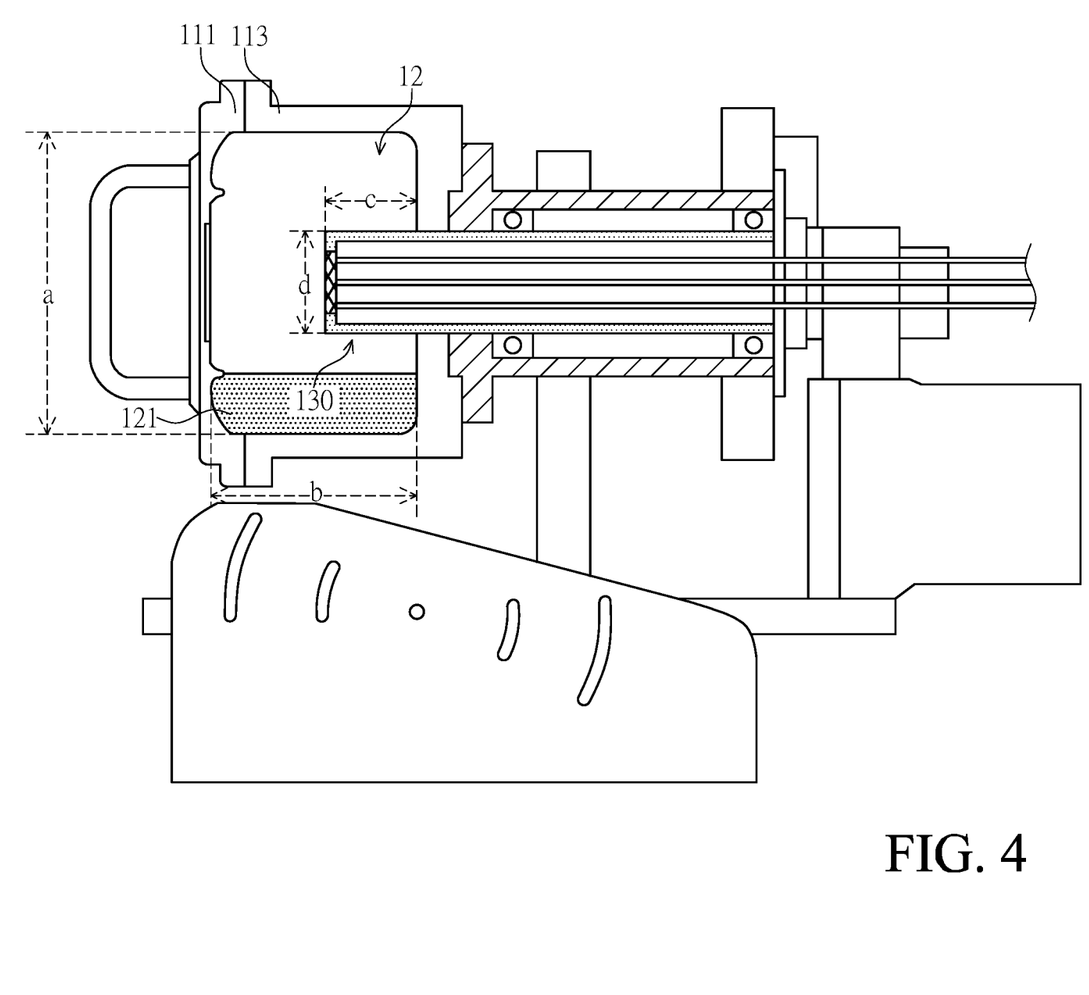
FIG. 4 is a cross-sectional schematic diagram of an atomic layer deposition apparatus for powders according to another embodiment of the present disclosure.

In the aforementioned embodiments, the reaction space 12 and the protruding tube part 130 are described to have a circular columnar shape, but in practice, the shapes of the reactions space 12 and the protruding tube part 130 are not limited to be circular columnar. The reaction space 12 may, for example, have a wavy circular columnar shape or a polygonal columnar shape. As shown in FIG. 4, at least one recess or protrusion of any geometric shape may be disposed on the inner surface of the cover lid 111 and/or the chamber 113 to enhance the diffusion of powders 121 in the reaction space 12. Under this circumstance, the first width a of the reaction space 12 is defined to be the widest width of the reaction space 12 and the first length b of the reaction space 12 is defined to be the longest length of the reaction space 12.

In one embodiment, the air intake line 173 and/or the non-reactive gas line 175 extend from the connection space 134 of the inner tube 133 in the shaft sealing device 13 to the reaction space 12 by, for example, passing through the filter unit 139 or a side wall of the protruding tube part 130 and into the reaction space 12. The air intake line 173 and/or the non-reactive gas line 175 in the reaction space 12 extend in a direction toward a surface of the reaction space 12.

In one embodiment, the atomic layer deposition apparatus 10 for powders further includes a support base 191 and at least one mount bracket 193, wherein the support base 191 is a board body for placing the driving unit 15, the vacuum chamber 11, and the shaft sealing device 13 thereon. The support base 191 is connected to the driving unit 15, and is connected to the shaft sealing device 13 and the vacuum chamber 11 through the driving unit 15. The shaft sealing device 13 and/or the vacuum chamber 11 can also be connected to the support base 191 through at least one support member so as to enhance the stability of connection.

The support base 191 is connected to the mount bracket 193 through at least one connecting shaft, wherein the number of mount brackets 193 is two and the two mount brackets 193 are respectively disposed at two sides of the support base 191. The support base 191 is rotatable relative to the mount brackets 193 with the connecting shaft 195 as axis, so as to change an inclination angle of the driving unit 15, the shaft sealing device 13, and the vacuum chamber 11, and in turn assist in the formation of a thin film with a uniform thickness on the surface of each powder 121.

Figure 5:
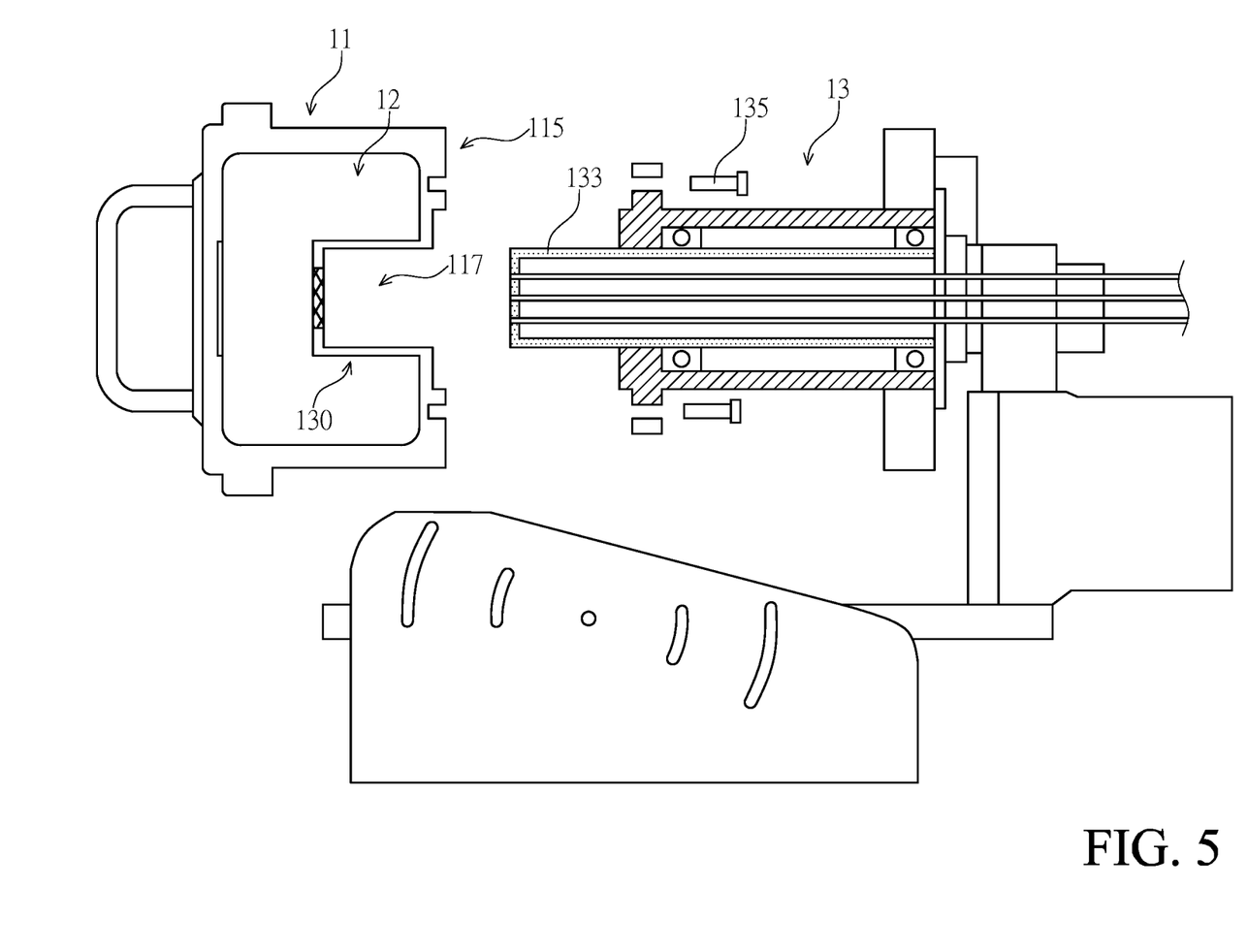
FIG. 5 is a cross-sectional exploded diagram of an atomic layer deposition apparatus for powders according to another embodiment of the present disclosure.

Referring to FIG. 5, the shaft sealing device 13 and the vacuum chamber 11 are two independent and detachable components, wherein corresponding connecting holes are respectively disposed on a bottom 115 of the vacuum chamber 11 and the shaft sealing device 13, and by passing a fixing member 135 through the connecting holes, the vacuum chamber 11 is fixed on the shaft sealing device 13. Once the fixing member 135 is dislodged, the vacuum chamber 11 separates from the shaft sealing device 13. Through the detachable mechanism, users can take down the vacuum chamber 11 from the shaft sealing device 13 to take out the powders 121 that have gone through ALD process in the vacuum chamber 11 and to clean the vacuum chamber 11. In practical application, when a vacuum chamber 11 which just underwent ALD process is taken down from the shaft sealing device 13, a vacuum chamber 11 which intends to undergo ALD process is fixed to the shaft sealing device 13 to enhance process efficiency.

Moreover, the vacuum chamber 11 has a recess 117 disposed at the bottom 115, wherein the recess 117 extends from the bottom 115 of the vacuum chamber 11 into the reaction chamber 12, and a part of the inner tube 133 of the shaft sealing device 13 is inserted into the recess 117, forming the protruding tube part 130 in the reaction space 12 of the vacuum chamber 11.

The above disclosure is only the preferred embodiment of the present disclosure, and not used for limiting the scope of the present disclosure. All equivalent variations and modifications on the basis of shapes, structures, features and spirits described in claims of the present disclosure should be included in the claims of the present disclosure.

The invention claimed is:

1. An atomic layer deposition apparatus for powders, comprising:
    a vacuum chamber, comprising a reaction space for accommodating a plurality of powders;
    a shaft sealing device, comprising an outer tube and an inner tube, wherein the outer tube comprises an accommodating space for accommodating the inner tube, the inner tube comprises a connection space, and the inner tube extends from the accommodating space of the outer tube into the reaction space of the vacuum chamber and forming a protruding tube part;
    a driving unit, mechanically connected to the vacuum chamber through the outer tube, for driving the vacuum chamber to rotate through the outer tube and the driving unit is not connected to the inner tube; wherein when the driving unit drives the outer tube and the vacuum chamber to rotate, the inner tube does not rotate with the outer tube and the vacuum chamber;
    at least one air extraction line, disposed in the connection space of the inner tube and fluidly connected to the reaction space of the vacuum chamber, for extracting a gas from the reaction space; and
    at least one air intake line, disposed in the connection space of the inner tube and fluidly connected to the reaction space of the vacuum chamber, for transporting a precursor or a non-reactive gas to the reaction space, wherein the non-reactive gas blows the powders around in the reaction space;
    wherein the reaction space comprises a first length, the protruding tube part comprises a second length, a direction of the first length of the reaction space and the second length of the protruding tube part is in parallel with a rotating axis of the vacuum chamber.

2. The atomic layer deposition apparatus of claim 1, wherein the reaction space comprises a wavy circular columnar shape, and the first length is a longest length of the reaction space.

3. The atomic layer deposition apparatus of claim 1, wherein the vacuum chamber further comprises a recess, the recess is disposed on a bottom of the vacuum chamber and extends from the bottom of the vacuum chamber into the reaction space for accommodating the inner tube, the vacuum chamber is fixed to the shaft sealing device through at least one fixing member, and the vacuum chamber separates from the shaft sealing device when the fixing member is dislodged.

4. The atomic layer deposition apparatus of claim 1, wherein the air intake line comprises at least one non-reactive gas line disposed in the inner tube and fluidly connected to the reaction space of the vacuum chamber for transporting the non-reactive gas to the reaction space of the vacuum chamber to blow the powders around in the reaction space.

5. The atomic layer deposition apparatus of claim 1, wherein the vacuum chamber comprises a cover lid, a chamber, and a monitor wafer, an inner surface of the cover lid covers the chamber to form the reaction space between the lid cover and the chamber, and the monitor wafer is disposed on the inner surface of the cover lid.

6. The atomic layer deposition apparatus of claim 1, wherein the air intake line extends from the inner tube into the reaction space.

7. The atomic layer deposition apparatus of claim 1, further comprising a filter unit disposed at one end of the inner tube connecting to the reaction space, wherein the gas extracted from the reaction chamber by the air extraction line passes through the filter unit.

8. An atomic layer deposition apparatus for powders, comprising:
    a vacuum chamber, comprising a reaction space for accommodating a plurality of powders;
    a shaft sealing device, comprising an outer tube and an inner tube, wherein the outer tube comprises an accommodating space for accommodating the inner tube, and the inner tube comprises a connection space;
    a driving unit, mechanically connected to the vacuum chamber through the outer tube, for driving the vacuum chamber to rotate through the outer tube and the driving unit is not connected to the inner tube; wherein when the driving unit drives the outer tube and the vacuum chamber to rotate, the inner tube does not rotate with the outer tube and the vacuum chamber;
    at least one air extraction line, disposed in the connection space of the inner tube and fluidly connected to the reaction space of the vacuum chamber, for extracting a gas from the reaction space; and
    at least one air intake line, disposed in the connection space of the inner tube and fluidly connected to the reaction space of the vacuum chamber, for transporting a precursor or a non-reactive gas to the reaction space, wherein the non-reactive gas blows the powders around in the reaction space;
    wherein the reaction space comprises a first width and a first length, a direction of the first length of the reaction space is in parallel with a rotating axis of the vacuum chamber, the first width is perpendicular to the first length.

9. The atomic layer deposition apparatus of claim 8, wherein the reaction space comprises a wavy circular columnar shape, the first length is a longest length of the reaction space, and the first width is a widest width of the reaction space.

10. The atomic layer deposition apparatus of claim 8, wherein the inner tube extends from the accommodating space of the outer tube into the reaction space of the vacuum chamber and forming a protruding tube part.

11. The atomic layer deposition apparatus of claim 10, wherein the vacuum chamber comprises a recess, the recess is disposed on an outer surface of the vacuum chamber and extends from the outer surface of the vacuum chamber to the reaction space for accommodating the inner tube, the vacuum chamber is fixed to the shaft sealing device through at least one fixing member, and the vacuum chamber separates from the shaft sealing device when the fixing member is dislodged.

12. The atomic layer deposition apparatus of claim 8, wherein the vacuum chamber comprises a cover lid, a chamber, and a monitor wafer, an inner surface of the cover lid covers the chamber to form the reaction space between the cover lid and the chamber, and the monitor wafer is disposed on the inner surface of the cover lid.

13. The atomic layer deposition apparatus of claim 8, wherein the air intake line extends from the inner tube into the reaction space.

14. The atomic layer deposition of claim 8, further comprising a filter unit disposed at an end of the inner tube connecting the reaction space, wherein the gas extracted from the reaction space by the air extraction line passes through the filter unit.

15. An atomic layer deposition apparatus for powders, comprising:
   a vacuum chamber, comprising a reaction space for accommodating a plurality of powders;
   a shaft sealing device, comprising an outer tube and an inner tube, wherein the outer tube comprises an accommodating space for accommodating the inner tube, the inner tube comprises a connection space, and the inner tube extends from the accommodating space of the outer tube into the reaction space of the vacuum chamber and forming a protruding tube part;
   a driving unit, mechanically connected to the vacuum chamber through the outer tube, for driving the vacuum chamber to rotate through the outer tube and the driving unit is not connected to the inner tube; wherein when the driving unit drives the outer tube and the vacuum chamber to rotate, the inner tube does not rotate with the outer tube and the vacuum chamber;
   at least one air extraction line, disposed in the connection space of the inner tube and fluidly connected to the reaction space of the vacuum chamber, for extracting a gas from the reaction space; and
   at least one air intake line, disposed in the connection space of the inner tube and fluidly connected to the reaction space of the vacuum chamber, for transporting a precursor or a non-reactive gas to the reaction space, wherein the non-reactive gas blows the find powders around in the reaction space;
   wherein the reaction space comprises a first width, the protruding tube part comprises a second width, a direction of the first width of the reaction space and the second width of the protruding tube part is perpendicular to a rotating axis of the vacuum chamber.

16. The atomic layer deposition apparatus of claim 15, wherein the reaction space comprises a wavy circular columnar shape, and the first width is a widest width of the reaction space.

17. The atomic layer deposition apparatus of claim 15, wherein the vacuum chamber comprises a recess, the recess is disposed on an outer surface of the vacuum chamber and extends from the outer surface of the vacuum chamber to the reaction space for accommodating the inner tube, the vacuum chamber is fixed to the shaft sealing device through at least one fixing member, and the vacuum chamber separates from the shaft sealing device when the fixing member is dislodged.

18. The atomic layer deposition apparatus of claim 15, wherein the vacuum chamber comprises a cover lid, a chamber, and a monitor wafer, an inner surface of the cover lid covers the chamber to form the reaction space between the cover lid and the chamber, and the monitor wafer is disposed on the inner surface of the cover lid.

19. The atomic layer deposition apparatus of claim 15, wherein the air intake line extends from the inner tube into the reaction space.

20. The atomic layer deposition apparatus of claim 15, further comprising a filter unit disposed at one end of the inner tube connecting to the reaction space, wherein the gas extracted from the reaction space by the air extraction line passes through the filter unit.

* * * * *